US009575527B2

(12) United States Patent
Stickel et al.

(10) Patent No.: US 9,575,527 B2
(45) Date of Patent: Feb. 21, 2017

(54) POWER DELIVERY CIRCUITRY

(71) Applicant: Micron Technology, Inc., Boise, ID (US)

(72) Inventors: Shaun Alan Stickel, Boise, ID (US); João Elmiro Chaves, Boise, ID (US); Kevin Roy Brandt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/487,991

(22) Filed: Sep. 16, 2014

(65) Prior Publication Data

US 2016/0077560 A1 Mar. 17, 2016

(51) Int. Cl.
*G11C 5/14* (2006.01)
*G06F 1/26* (2006.01)
*G11C 11/4074* (2006.01)

(52) U.S. Cl.
CPC . *G06F 1/26* (2013.01); *G11C 5/14* (2013.01); *G11C 11/4074* (2013.01)

(58) Field of Classification Search
CPC ............ G06F 1/266; G11C 5/147; G11C 5/14; G11C 11/4074; G11C 16/30
See application file for complete search history.

(56) References Cited

U.S. PATENT DOCUMENTS

| | | | | |
|---|---|---|---|---|
| 5,982,146 A | * | 11/1999 | Nguyen | ................ H02J 7/0057 320/131 |
| 2010/0241890 A1 | * | 9/2010 | Goodart | .................. G06F 1/263 713/340 |
| 2012/0023339 A1 | * | 1/2012 | Chueh | ..................... G06F 1/263 713/300 |

* cited by examiner

*Primary Examiner* — Richard Elms
*Assistant Examiner* — Mohammed A Bashar
(74) *Attorney, Agent, or Firm* — Fletcher Yoder, P.C.

(57) ABSTRACT

Embodiments of the present disclosure are directed to systems and methods for a memory device comprising a memory system and power delivery circuitry comprising an energy storage, wherein the power delivery circuitry is configured to simultaneously deliver a first power from the energy storage and a second power from an external power supply coupled to the memory device.

24 Claims, 3 Drawing Sheets

POWER DELIVERY CIRCUITRY

BACKGROUND

1. Field of the Invention

Embodiments of the present invention relate generally to the field of memory devices and other systems and more particularly, to systems and methods of providing power for memory devices and other systems.

2. Description the Related Art

Computer systems and other electrical systems generally include one or more memory devices. Memory devices generally include circuits (e.g., integrated circuits, semiconductor circuits, etc.) configured to store data. For example, the memory devices may include volatile and/or non-volatile memory. Examples of types of volatile memory, which require power to retain stored information, include random-access memory (RAM), dynamic random access memory (DRAM), synchronous dynamic random access memory (SDRAM), among others. Non-volatile memory does not require power to retain stored information and can include read only memory (ROM), flash memory (e.g., NAND flash memory and NOR flash memory), phase change random access memory (PCRAM), resistive random access memory (RRAM), magnetic random access memory (MRAM), and so forth.

Solid state drives (SSDs) may be formed with various types of memory devices (e.g., solid state memory devices). Unlike hard disk drives (HDDs), solid state drives do not include moving parts, and therefore may not be susceptible to vibration, shock, magnetic fields, etc., and may have reduced access times and latency. A solid state drive can be formed from volatile memory devices and/or non-volatile memory devices. For example, a solid state drive may be a NAND flash memory device that does not include an internal battery. In certain configurations, the solid state drive may be connected to an external power supply. Unfortunately, power requirements (e.g., temporary power requirements) of the solid state drive may exceed the power supplying capacity of the external power supply. As a result, solid state drives may experience an increase in latency (i.e., response time) during periods when power demand of the solid state drive exceeds the power supplying capacity of the external power supply.

DETAILED DESCRIPTION OF SPECIFIC EMBODIMENTS

Embodiments of the present disclosure are directed to a system including a memory device having power delivery circuitry configured to deliver more power to the system than can be provided by a power source (e.g., an external power source). For example, the power delivery circuitry of the memory device may include an onboard energy storage configured to store available input power (i.e., energy) of the external power source in the energy storage when the memory device is not using all of the power supplied by the external power supply. In other words, when the memory device is idle or in another mode not utilizing all of the power available from the external power supply, the power delivery circuitry may draw power from the external power supply and store energy in the onboard energy storage of the power delivery circuitry. Thereafter, when the memory device demands an amount of power in excess of the power limit of the external power supply, additional energy stored in the onboard energy storage may be released and used by the memory device. In this manner, the memory device may utilize more power than the external power supply is capable of providing without overloading the external power supply. As discussed in detail below, the power delivery circuitry may enable improved performance of the memory device. For example, the power delivery circuitry may enable a reduction in latency (i.e., response time) of the memory device. In certain embodiments, the power delivery circuitry may also be utilized as a power backup system. For example, if the power supplying capacity of the external power supply becomes unavailable, energy stored in the energy storage may be used to temporarily power the memory device. While the present embodiments describe the power delivery circuitry in the context of a memory device, it should be noted that the power delivery circuitry described below may also be used with other systems that draw power from a power supply. For example, the disclosed power delivery circuitry may be used with a video card, a personal computer motherboard, a cellular phone, or other system.

Figure 1:
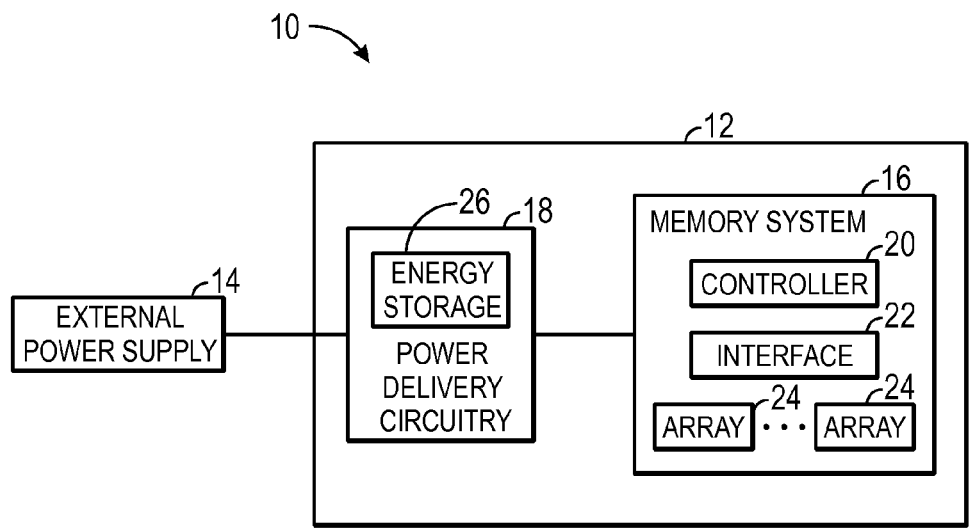
FIG. 1 is a block diagram of a system having an external power supply and memory device with power delivery circuitry, in accordance with an embodiment.

Referring now to the drawings, FIG. 1 is a block diagram that depicts a system 10 including a memory device 12 powered by an external power supply 14. The system 10 may be any of a variety of types, such as those used in a personal computer, pager, cellular phone, personal organizer, control circuit, laptop computer, digital camera, digital media player, etc. The memory device 12 may be any of a variety of memory devices configured to store data, such as a solid state drive. As will be appreciated, the external power supply 14 provides power to the memory device 12 to enable operation of the memory device 12.

In the illustrated embodiment, the memory device 12 (e.g., solid state drive) includes a memory system 16 and power delivery circuitry 18. The power delivery circuitry 18 will be described in further detail below. As shown, the memory system 16 includes a controller 20, an interface 22, and memory arrays 24 (e.g., solid state memory arrays). The controller 20 communicates with the memory arrays 24 to read, write, and/or erase data on the memory arrays 24. Additionally, the controller 20 may communicate with another system or device coupled to the memory device 12 or the system 10. For example, the controller 20 may communicate with another system or device through the interface 22. As such, the interface 22 may be configured to transmit data, power, input/output signals, or other types of signals. In certain embodiments, the interface 22 may be an integrated drive electronics (IDE) interface, an advanced technology attachment (ADA) interface, a serial advanced technology attachment (SATA) interface, a parallel advanced technology attachment (PATA) interface, or other type of interface.

As mentioned above, the memory device 12 includes power delivery circuitry 18. The power delivery circuitry 18 is configured to deliver power from the external power supply 14 to the memory system 16 of the memory device 12. Additionally, in certain embodiments, the power delivery circuitry 18 may be configured to store energy supplied by the external power supply 18, and the stored energy may be released and delivered to the memory system 16 when a power demand of the memory system 16 exceeds the power supplying limits of the external power supply 18. To this end, the power delivery circuitry 18 includes an energy storage 26. For example, the energy storage 26 may be a battery, a capacitor, a super capacitor, or other type of energy storage. In the manner described below, the power delivery circuitry 18 may draw and store available input energy of the external power source 14 in the energy storage 26 when the memory device 12 is not using all of the available power supplied by the external power supply 14 or when the memory system 16 is idle. Thereafter, during events when the memory system 16 demands a level of power in excess of the power supply limit of the external power supply 14, the energy stored within the energy storage 26 may be released and delivered, along with the power from the external power supply 14, to the memory system 16 by the power delivery circuitry 18.

For example, in one embodiment, the external power supply 14 may be capable of supplying nine volts of power. However, the memory system 16 (e.g., solid state drive) of the memory device 12 may have idle periods or other operational periods when the memory system 16 does not use nine volts of power. Instead, the memory system 16 may operate using less than nine volts (e.g., 8, 6, 4, or fewer volts). During such idle or operational periods, the power delivery circuitry 18 may supply the fewer than nine volts demanded by the memory system 16, and the power delivery circuitry 18 may draw additional voltage from the external power supply 14 to store the additional voltage in the energy storage 18. If the memory system 16 later demands power in excess of nine volts (e.g., in excess of the power supply limit of the external power supply 14), the power delivery circuitry 18 may deliver the nine volts supplied by the external power supply 14 along with additional voltage from the energy storage 26 to meet the demand of the memory system 16. For example, if the memory system 16 demands ten volts of power during a peak workload of the memory system 16, the power delivery circuitry 18 may simultaneously deliver nine volts supplied by the external power supply 14 and one volt supplied by the energy storage 26 to the memory system 16. As a result, performance of the memory system 16 may be improved. More specifically, the memory system 16 may not throttle performance back to operate within the power supply limit of the external power supply 14. Instead, the memory system 16 may perform a data transaction at a faster rate, and latency of the memory system 16 may be reduced.

Figure 2:
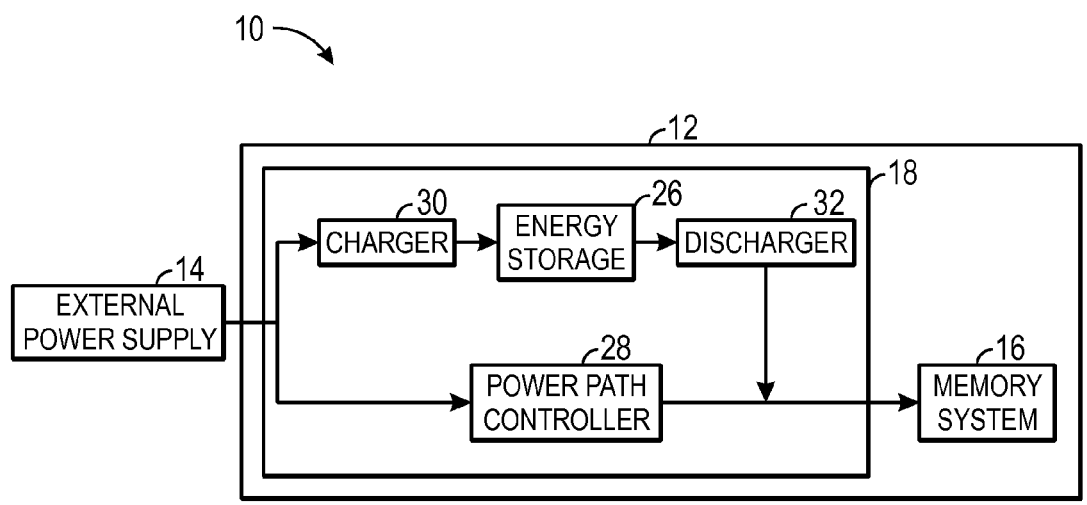
FIG. 2 is a block diagram of a system having an external power supply and memory device with power delivery circuitry, illustrating an embodiment of the power delivery circuitry.
Figure 3:
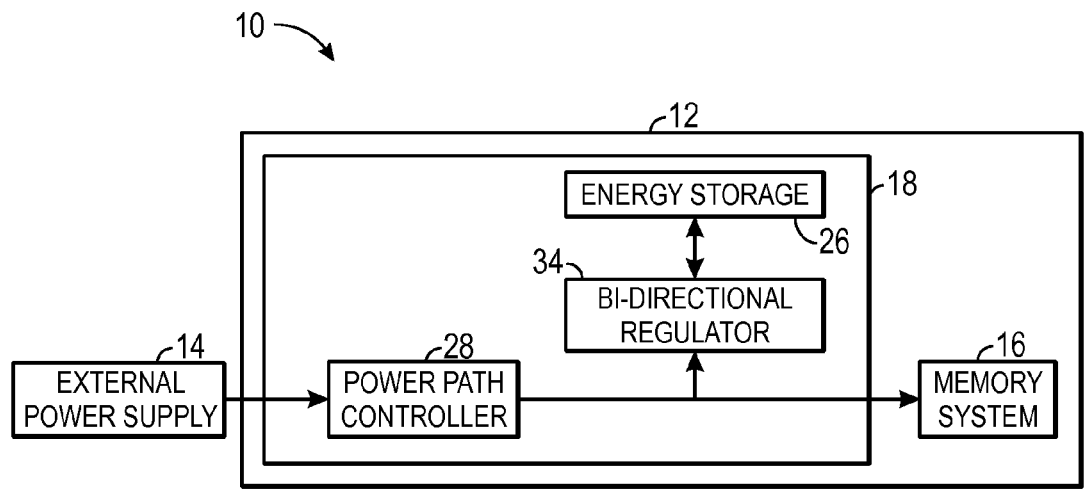
FIG. 3 is a block diagram of a system having an external power supply and memory device with power delivery circuitry, illustrating another embodiment of the power delivery circuitry.
Figure 4:
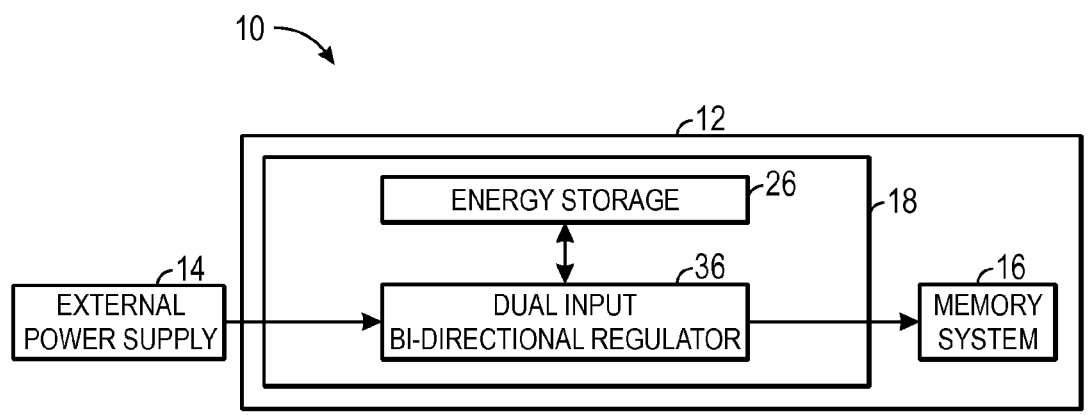
FIG. 4 is a block diagram of a system having an external power supply and memory device with power delivery circuitry, illustrating another embodiment of the power delivery circuitry.

FIGS. 2-4 are block diagrams of the system 10 having the external power supply 14 and the memory device 12, illustrating various embodiments of the power delivery circuitry 18 of the memory device 12. More specifically, the embodiments shown in FIGS. 2-4 illustrate various circuit topologies of the power delivery circuitry 18. For example, FIG. 2 illustrates an embodiment of the power delivery circuitry 18 having the energy storage 26, a power path controller 28, a charger 30, and a discharger 32.

The power path controller 28 is configured to detect an amount of power or energy supplied from the external power supply 14 to the memory system 16. For example, the power path controller 28 may be configured to monitor a level of electrical current passing from the external power supply 14 to the memory system 16. Additionally, the power path controller 28 may be configured to control the direction of current flow through the power path controller 28. If the power path controller 28 detects that the amount of power supplied from the external power supply 14 to the memory system 16 is below a maximum power amount that the external power supply 14 is capable of providing, then the power path controller 28 may direct additional power (e.g., current) supplied by the external power supply 14 to the charger 30. The charger 30 supplies the additional power (e.g., voltage and/or current) to the energy storage 26 to store additional energy until it is demanded by the memory system 16.

During events when the memory system 16 demands a level of power in excess of the power supply limit of the external power supply 14, the power path controller 28 may detect that the current passing from the external power supply 14 to the memory system 16 may be approaching or exceeding a predetermined threshold value. For example, the predetermined threshold value may be a power supply limit of the external power supply. In other embodiments, the predetermined threshold value may be another current value lower than the power supply limit of the external power supply to help reduce overheating and/or tripping of the external power supply 14. When the power path controller 28 detects that the current passing from the external power supply 14 to the memory system 16 approaches or exceeds the predetermined threshold value, the discharger 32 may draw energy (e.g., voltage and/or current) from the energy storage 26 and deliver the stored energy to the memory system 16. As shown, the power delivered by the discharger 32 may be combined with the power passing from the external power supply 14 to the memory system 16, and the total power may be delivered to the memory system 16 by the power delivery circuitry 18.

FIG. 3 illustrates an embodiment of the power delivery circuitry 18 having the energy storage 26, the power path controller 28, and a bi-directional regulator 34. The power path controller 28 may function as similarly described above with respect to FIG. 2. That is, the power path controller 28 is configured to monitor and control a level of electrical current passing from the external power supply 14 to the memory system 16. The bi-directional regulator 34 is configured to operate based on feedback from the power path controller 28. For example, the operation of the bi-directional regulator 34 may based on a level of current passing from the external power supply 14 to the memory system 16 that is detected by the power path controller 28. If the power path controller 28 detects that the amount of power supplied from the external power supply 14 to the memory system 16 is below a maximum power amount that the external power supply 14 is capable of providing, then the bi-directional regulator may direct additional power (e.g., current) supplied by the external power supply 14 to the energy storage 26. In certain embodiments, the bi-directional regulator 34 may step up the voltage or step down the voltage before directing the power to the energy storage 28.

When the energy storage 28 has reached full capacity, the bi-directional regulator 34 may communicate with the power path controller 28, and the power path controller 28 may block additional power or voltage from traveling back to the external power supply 14. As similarly described above, when the memory system 16 demands a level of power in excess of the power supply limit of the external power supply 14, the power path controller 28 may detect that the current passing from the external power supply 14 to the memory system 16 is approaching or exceeding a predetermined threshold value. In such conditions, the bi-directional regulator 34 may draw energy (e.g., voltage and/or current) from the energy storage 26 and deliver the stored energy to the memory system 16. When drawing energy from the energy storage 26, the bi-directional regulator 34 may once again step up the voltage or step down the voltage before directing the power to the memory system 16. The energy drawn by the bi-directional regulator 34 from the energy storage 26 is combined with the power passing from the external power supply 14 to the memory system 16 (i.e., through the power path controller 28), and the combined power is delivered to the memory system 16 by the power delivery circuitry 18.

FIG. 4 illustrates an embodiment of the power delivery circuitry 18 having the energy storage 26, and a dual input bi-directional regulator 36. The dual input bi-directional regulator 36 may perform the combined functions of the power path controller 28 and the bi-directional regulator 34 described above. That is, the dual input bi-directional regulator 36 may be configured to monitor and control a level of electrical current passing from the external power supply 14 to the memory system 16, and the dual input bi-directional regulator 36 may also direct additional power unused by the memory device to the energy storage 26. Similarly, when the power demanded by the memory system 16 exceeds a predetermined threshold (e.g., a power supplying limit of the external power supply 14), the dual input bi-directional regulator 36 may draw stored energy from the energy storage 26, combine the stored energy with the power supplied by the external power supply 14, and deliver the combined power to the memory system 16. In certain embodiments, the dual input bi-directional regulator 36 may also be configured to step up or step down voltage supplied to and/or drawn from the energy storage 26.

Figure 5:
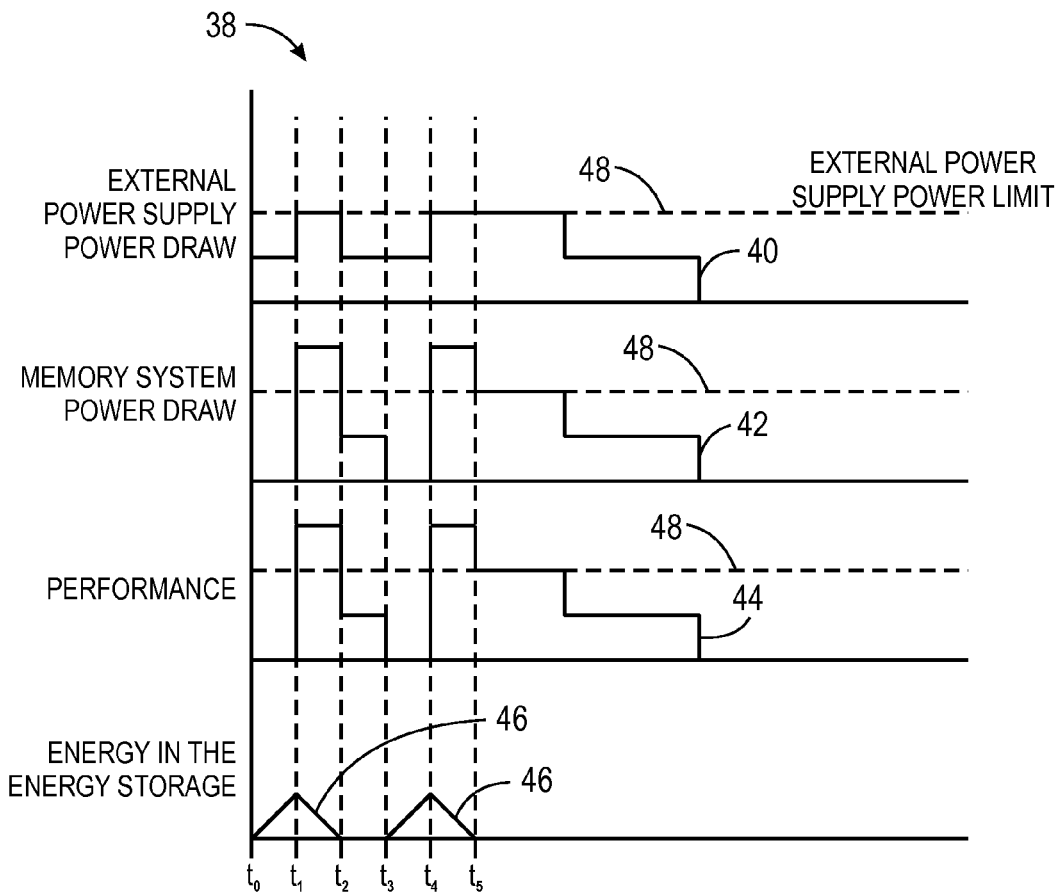
FIG. 5 is a graph illustrating operation of the system of FIG. 1, in accordance with an embodiment.

FIG. 5 is a graph 38 illustrating operation of the system 10 having the memory device 12 with the power delivery circuitry 18. In graph 38, line 40 represents power drawn from the external power supply 14, line 42 represents power drawn by the memory system 16, line 44 represents performance of the memory device 12, and line 46 represents an amount of energy in the energy storage 26. At a time $t_0$, the memory system 16 may be idle and/or may not be drawing any power from the external power supply 14. Although the memory system 16 is not drawing power from the external power supply 14, the power delivery circuitry 18 of the memory device 12 may draw power from the external power supply 14 and direct the power to the energy storage 26. Specifically, between time $t_0$ and time $t_1$, line 40 indicates that power is supplied by the external power supply 14, and line 46 indicates that the energy stored in the energy storage 26 is increasing.

At time $t_1$, the memory system 16 begins to demand a level of power that exceeds the power supply limit of the external power supply 14. In graph 38, the external power supply 14 power limit is represented by dashed line 48. Between times $t_1$ and $t_2$, the memory system 16 demands power in excess of the power supply limit of the external power supply 14, as indicated by line 42, but the power supplied by the external power supply 14 does not exceed the external power supply power supply limit, as indicated by line 40. In certain circumstances, the increased power demand of the memory system 16 may be due to a work overload. Nevertheless, the performance of the memory device 12, indicated by line 44, is not reduced because the power delivery circuitry 18 draws energy from the energy storage 26 to supplement the power supplied by the external power supply 14. As will be appreciated, the energy within the energy storage 26 begins to deplete when the power delivery circuitry 18 draws energy from the energy storage 26, as indicated by line 46 between times $t_1$ and $t_2$. At time $t_2$, the energy stored in the energy storage 26 is fully depleted.

Additionally, at time $t_2$, the power demanded by the memory system 16 decreases to a level below the external power supply 14 limit, as indicated by lines 40 and 42. For example, at time $t_2$, the work overload experienced by the memory system 16 between times $t_1$ and $t_2$ may end, and the power demanded by the memory system 16 may decrease as a result. Between times $t_2$ and $t_3$, the memory device 12 may be operating under normal load conditions.

At time $t_3$, the power demanded by the memory system 16 decreases to zero, as indicated by line 42. However, as indicated by line 40 at time $t_3$, the power supplied by the external power supply 14 does not fall to zero because the power delivery circuitry 18 continues to draw power from the external power supply 14 and direct the power to the energy storage 26, as indicated by line 46. Between times $t_3$ and $t_4$, the memory system 16 remains in an idle or non-operating state, as indicated by line 42, which enables the power delivery circuitry 18 to direct unused power from the external power supply 14 to the energy storage 26.

At time $t_4$, the memory system 16 once again demands a level of power that exceeds the power supply limit of the external power supply 14. Between times $t_4$ and $t_5$, the power delivery circuitry 18 supplies combined power from the external power supply 14 and the energy storage 26 to meet the power demand of the memory system 16. As a result, the performance of the memory system 16 is not reduced, as indicated by line 44 between times $t_4$ and $t_5$. However, at time $t_5$, the energy stored in the energy storage 26 is depleted. As a result, the power delivery circuitry 18 is only able to supply power to the memory system 16 from the external power supply 14. That is, the power delivery circuitry 18 is able to supply a level of power to the memory system 16 up to the power supply limit of the external power supply 14. As the memory system 16 is not supplied with the full amount of power demanded by the memory system 16, the performance of the memory system 16 is reduced, as indicated by line 44 at time $t_5$. The reduction in performance may be evidenced by increased latency and an increase in response times of the memory device 12.

Figure 6:
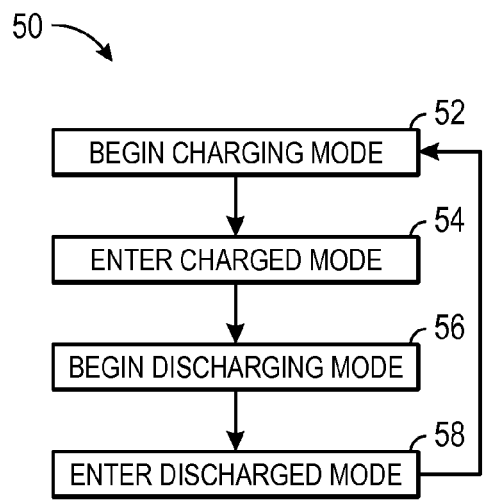
FIG. 6 is a flow diagram illustrating operation of the power delivery circuitry of the memory device, in accordance with an embodiment.

FIG. 6 is a flow diagram 50 illustrating operation of the power delivery circuitry 18 of the memory device 12. The power delivery circuitry 18 includes four different modes of operation. First, as indicated by block 52, the power delivery circuitry 18 begins with a charging mode. In the charging mode, the power demand of the memory system 16 is less than the power supply limit of the external power supply 14. As a result, the energy storage 26 of the power delivery circuitry 18 may be charged using the input power supply of the external power supply 14 that is not demanded by the memory device 16. The power delivery circuitry 18 may remain in charging mode for as long as the energy storage 26 has capacity to store more energy and while the external power supply 14 has available power supplying capacity.

Once the energy storage 26 is fully charged, the power delivery circuitry 18 enters a charged mode, as indicated by block 54. More specifically, the power delivery circuitry 18 is in charged mode when the memory system 16 is still not demanding all of the power that the external power supply 14 can provide, but the energy storage 26 is fully charged. As a result, the power delivery circuitry 18 does not draw additional power from the external power supply 14.

As indicated by block 56, the power delivery circuitry 18 also has a discharging mode. The power delivery circuitry 18 begins discharging mode when the memory system 16 demands more power than the external power supply 14 can provide and when there is available energy in the energy storage 26. In the discharging mode, energy from the energy storage 26 is discharged and supplied to the memory device 16 by the power delivery circuitry 18. The discharging mode may only last for as long as there is available energy in the energy storage 26.

Finally, as indicated by block 58, the power delivery circuitry 18 has a discharged mode. In discharged mode, the energy storage 26 is fully depleted of stored energy. As a result, if the memory system 16 demands more power than the external power supply 14 can provide, the operation of the memory device 16 is throttled back. Once the power demand of the memory system 16 falls below the power supply limit of the external power supply 14, the power delivery circuitry 18 may again enter charging mode, indicated by block 52, and the extra power supply capacity of the external power supply 14 that is unused by the memory system 16 may instead be used to begin charging the energy storage 26 again.

As described in detail above, embodiments of the present disclosure are directed to a system, such as the memory device 12, having power delivery circuitry 18 configured to deliver more power to the memory device 12 than can be provided by a power source, such as the external power supply 14. The power delivery circuitry 18 of the memory device 12 includes the onboard energy storage 26, which is configured to store available input power (i.e., energy) of the external power source 14 in the energy storage 26 when the memory device 12 is not using all of the available power supplied by the external power supply 14. In other words, when the memory device 12 is idle or in another mode not utilizing all of the power available from the external power supply 14, the power delivery circuitry 18 may draw power from the external power supply 14 and store energy in the onboard energy storage 26 of the power delivery circuitry 18. Thereafter, when the memory device 12 demands an amount of power in excess of the power limit of the external power supply 14, additional energy stored in the onboard energy storage 26 may be released and used by the memory device 12. In this manner, the memory device 12 may utilize more power than the external power supply 14 is capable of providing without overloading the external power supply 14. As a result, the power delivery circuitry 18 may enable improved performance of the memory device 12. For example, the power delivery circuitry 18 may enable a reduction in latency (i.e., response time) of the memory device 12. In certain embodiments, the power delivery circuitry 18 may also be utilized as a power backup system. For example, if the power supplying capacity of the external power supply 14 becomes unavailable, energy stored in the energy storage 26 may be used to temporarily power the memory device 12.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system, comprising:
  a memory device, comprising:
    a memory system; and
    power delivery circuitry comprising an energy storage, wherein the power delivery circuitry is configured to simultaneously deliver to the memory system a first power from the energy storage and a second power from an external power supply coupled to the memory device when a power demand of the memory system exceeds a power supply limit of the external power supply and further configured to discontinue delivery of the first power when the power demand of the memory system does not exceed the power supply limit of the external power supply.

2. The system of claim 1, wherein the memory device comprises a solid state memory device.

3. The system of claim 1, wherein the power delivery circuitry comprises a power path controller configured to monitor a current of the second power.

4. The system of claim 3, wherein the power delivery circuitry comprises a charger configured to charge the energy storage using energy from the external power supply and a discharger configured to draw the first power from the energy storage.

5. The system of claim 3, wherein the power delivery circuitry comprises a bi-directional regulator configured to charge the energy storage using power supplied from the external power supply and draw the first power from the energy storage.

6. The system of claim 5, wherein the bi-directional regulator is configured to step down a voltage of the energy used to charge the energy storage, step up the voltage of the first power drawn from the energy storage, or both.

7. The system of claim 3, wherein the power path controller is configured to block current from passing from the energy storage to the external power supply after the energy storage is charged to full capacity.

8. The system of claim 3, wherein the power delivery circuitry is configured to simultaneously deliver the first power from the energy storage and the second power from the external power supply when the power path controller detects that the current of the second power exceeds a predetermined threshold.

9. The system of claim 1, wherein the power delivery circuitry comprises a dual input bi-directional regulator configured to monitor a current of the second power, charge the energy storage using energy from the external power supply, and draw the first power from the energy storage.

10. The system of claim 1, wherein the energy storage comprises a battery, a capacitor, a super-capacitor, or any combination thereof.

11. A method, comprising:
  sensing, in a memory device, a first current of a first power supplied to a memory system of the memory device by an external power supply;

detecting that the first current exceeds a predetermined threshold value;

drawing a second power from an onboard energy storage of power delivery circuitry of the memory device when the first current exceeds the predetermined threshold value;

simultaneously delivering the first power and the second power to the memory system of the memory device with the power delivery circuitry when a power demand of the memory system exceeds a power supply limit of the external power supply; and discontinuing delivering the first power to the memory system when the power demand of the memory system does not exceed the power supply limit of the external power supply.

12. The method of claim 11, comprising:

charging the onboard energy storage with energy from the external power supply when a power demand of the memory system is less than the predetermined threshold value.

13. The method of claim 12, wherein charging the onboard energy storage with energy from the external power supply comprises charging a battery, a capacitor, a super-capacitor, or a combination thereof.

14. The method of claim 11, comprising detecting that the first current exceeds the predetermined threshold value with a power path controller.

15. The method of claim 11, comprising detecting that the first current exceeds the predetermined threshold value with a dual input bi-directional regulator.

16. The method of claim 11, comprising blocking current from traveling from the onboard energy storage to the external power supply when the onboard energy storage is fully charged.

17. A system, comprising:
an external power supply; and
a solid state memory device, comprising:
  a memory system; and
  power delivery circuitry comprising an energy storage, wherein the power delivery circuitry is configured to simultaneously deliver a first power from the external power supply coupled to the memory device and a second power from the energy storage when a power demand of the memory system is greater than a power supply limit of the external power supply and further configured to discontinue delivery of the first power when the power demand of the memory system does not exceed the power supply limit of the external power supply.

18. The system of claim 17, wherein the power delivery circuitry is configured to charge the energy storage with available power from the external power supply when the power demand of the memory system is less than the power supply limit of the external power supply.

19. The system of claim 17, wherein the energy storage comprises a battery, a capacitor, a super-capacitor, or any combination thereof.

20. A solid state memory device, comprising:
a memory system; and
power delivery circuitry, comprising:
  an onboard energy storage, wherein the power delivery circuitry is configured to simultaneously deliver to the memory system a first power from the onboard energy storage and a second power from an external power supply coupled to the solid state memory device when a current of the second power exceeds a predetermined threshold value, indicating a power supply limit of the external power supply and further configured to discontinue delivery of the first power when the power demand of the memory system does not exceed the power supply limit of the external power supply.

21. The solid state memory device of claim 20, wherein the power delivery circuitry is configured to deliver the first power from the onboard energy storage to the memory system when the second power from the external power supply becomes unavailable.

22. The solid state memory device of claim 20, wherein the power delivery circuitry comprises a power path controller configured to detect when the current of the second power exceeds the predetermined threshold value.

23. The solid state memory device of claim 20, wherein the predetermined threshold value is equal to a power supply limit of the external power supply.

24. The solid state memory device of claim 20, wherein the power delivery circuitry is configured to block current from traveling from the onboard energy storage to the external power supply when the onboard energy storage is fully charged.

* * * * *